US009647002B2

(12) United States Patent
Wu et al.

(10) Patent No.: US 9,647,002 B2
(45) Date of Patent: May 9, 2017

(54) ARRAY SUBSTRATE, MANUFACTURE METHOD THEREOF, AND DISPLAY DEVICE WITH THE ARRAY SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Hongjiang Wu, Beijing (CN); Jianfeng Yuan, Beijing (CN)

(73) Assignees: BOE Technology Group Co., Ltd., Beijing (CN); Beijing BOE Display Technology Co., Ltd., Beijing (CN)

(*) Notice: Subject to any disclaimer, the term of this patent is extended or adjusted under 35 U.S.C. 154(b) by 0 days.

(21) Appl. No.: 14/427,770

(22) PCT Filed: Jul. 30, 2014

(86) PCT No.: PCT/CN2014/083353
§ 371 (c)(1),
(2) Date: Mar. 12, 2015

(87) PCT Pub. No.: WO2015/062323
PCT Pub. Date: May 7, 2015

(65) Prior Publication Data
US 2015/0311225 A1 Oct. 29, 2015

(30) Foreign Application Priority Data
Oct. 28, 2013 (CN) .......................... 2013 1 0516917

(51) Int. Cl.
H01L 27/14 (2006.01)
H01L 29/04 (2006.01)
(Continued)

(52) U.S. Cl.
CPC .......... *H01L 27/124* (2013.01); *G02F 1/1362* (2013.01); *G02F 1/136209* (2013.01);
(Continued)

(58) Field of Classification Search
CPC ........... G02F 1/136286; G02F 1/13624; G02F 1/1368; G02F 2201/40; G02F 1/133345;
(Continued)

(56) References Cited
U.S. PATENT DOCUMENTS 8,916,879 B2    12/2014  Huang
2009/0195489 A1*  8/2009  Hung ................ G02F 1/136286
                                                        345/92
(Continued)

FOREIGN PATENT DOCUMENTS

CN    101847640 A    9/2010
CN    102707450 A    10/2012
(Continued)

OTHER PUBLICATIONS

International Search Report with Notice of Transmittal of the International Search Report of PCT/CN2014/083353 in Chinese, mailed Nov. 2, 2014.
(Continued)

Primary Examiner — Thao X Le
Assistant Examiner — Nduka Ojeh
(74) Attorney, Agent, or Firm — Collard & Roe, P.C.

(57) ABSTRACT

An array substrate, a manufacture method thereof, and a display device with the array substrate are provided. The array substrate includes a substrate; a first gate scanning line; a first gate insulating layer; an active layer; a date scanning line; a pixel electrode formed in a pixel unit defined by the first gate scanning line and the data scanning line and over the data scanning line; and a second gate scanning line formed over or below the first gate scanning
(Continued)

line. The second gate scanning line is substantially overlapped with the first gate scanning line in a stacking direction of the array substrate, and is arranged to be insulated from the first gate scanning line, the active layer, the data scanning line, and the pixel electrode, respectively.

12 Claims, 6 Drawing Sheets

(51) Int. Cl.
 H01L 29/15 (2006.01)
 H01L 31/036 (2006.01)
 H01L 27/12 (2006.01)
 G02F 1/1362 (2006.01)
 G09G 3/36 (2006.01)
(52) U.S. Cl.
 CPC ....... *G09G 3/3659* (2013.01); *H01L 27/1237* (2013.01); *H01L 27/1259* (2013.01)
(58) Field of Classification Search
 CPC ......... G02F 1/1362; G02F 2001/13606; H01L 27/124; H01L 27/1248; H01L 27/12; H01L 29/7869; H01L 27/1237; H01L 27/1259; G09G 3/3659
 USPC ................. 257/57, 59, E29.273, 72; 438/34; 345/92, 204
 See application file for complete search history.

(56) References Cited

U.S. PATENT DOCUMENTS

| 2010/0156954 | A1 | 6/2010 | Kim et al. |
| 2010/0245735 | A1 | 9/2010 | Xie et al. |
| 2012/0104394 | A1* | 5/2012 | Park ...................... H01L 27/124 257/59 |
| 2013/0228756 | A1* | 9/2013 | Lee .......................... H01L 51/52 257/40 |

FOREIGN PATENT DOCUMENTS

| CN | 103278985 A | 9/2013 |
| CN | 103513483 A | 1/2014 |
| TW | 200935149 A | 8/2009 |

OTHER PUBLICATIONS

Written Opinion of the International Searching Authority of PCT/CN2014/083353 in Chinese with English translation mailed Nov. 2, 2014.
Chinese Office Action of Chinese Application No. 201310516917.2, mailed Jul. 16, 2015 with English translation.
Second Chinese Office Action in Chinese Application No. 2013105169172, mailed Dec. 30, 2015 with English translation.

* cited by examiner

Fig.14A
Fig.14B
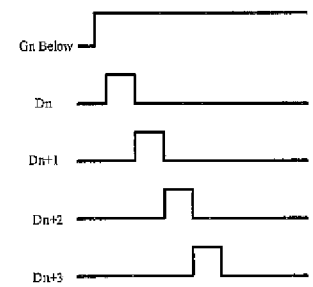
Fig.15A
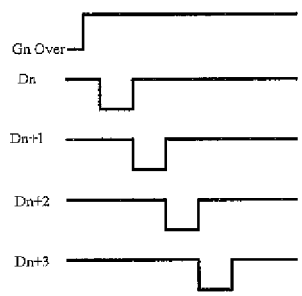
Fig.15B $G_n$ Below/Over

| + |   | + |   | + |   | + |   | + |   | + |   |
|---|---|---|---|---|---|---|---|---|---|---|---|
|   | + |   | + |   | + |   | + |   | + |   | + |

$G_{n+1}$ Below/Over

| + |   | + |   | − |   | + |   | + |   | + |   |
|---|---|---|---|---|---|---|---|---|---|---|---|
|   | + |   | + |   | + |   | + |   | + |   | + |

$G_{n+2}$ Below/Over

| + |   | + |   | − |   | + |   | + |   | + |   |
|---|---|---|---|---|---|---|---|---|---|---|---|
| ⋮ | + |   | + |   | + |   | + |   | + |   | + |

Fig.16A $G_n$ Below/Over

| + | − | + | − | + | − | + | − | + | − | + | − |
|---|---|---|---|---|---|---|---|---|---|---|---|
| − | + | − | + | − | + | − | + | − | + | − | + |

$G_{n+1}$ Below/Over

| + | − | + | − | + | − | + | − | + | − | + | − |
|---|---|---|---|---|---|---|---|---|---|---|---|
| − | + | − | + | − | + | − | + | − | + | − | + |

$G_{n+2}$ Below/Over

| + | − | + | − | + | − | + | − | + | − | + | − |
|---|---|---|---|---|---|---|---|---|---|---|---|
| ⋮ − | + | − | + | − | + | − | + | − | + | − | + |

Fig.16B

ARRAY SUBSTRATE, MANUFACTURE METHOD THEREOF, AND DISPLAY DEVICE WITH THE ARRAY SUBSTRATE

CROSS REFERENCE TO RELATED APPLICATIONS

This application is the National Stage of PCT/CN2014/083353 filed on Jul. 30, 2014, which claims priority under 35 U.S.C. §119 of Chinese Application No. 201310516917.2 filed on Oct. 28, 2013, the disclosure of which is incorporated by reference.

TECHNICAL FILED

Embodiments of the present invention relate to an array substrate, a manufacture method of array substrate, and a display device.

BACKGROUND

With development of display technology, display panels having high transmittance, large size, low energy consumption and low cost have become a developing tendency in future.

Most gate scanning lines in array substrates of TFT-LCD have a single-line structure. FIG. 1 is a top view illustrating a structure of an array substrate, and FIG. 2 is a sectional view taken along line A-A in FIG. 2. As shown in FIG. 1 and FIG. 2, a gate scanning line 12 is formed on a glass substrate 11, and an insulating layer 13 is covered on the gate scanning line 12; the insulating layer 13 is usually consisted of silicon nitride. An active layer 14 is formed on the insulating layer 13, and a data scanning line 15 is formed on the active layer 14; the data scanning line 15 is etched to form a source electrode and a drain electrode of a thin film transistor (TFT). A protective layer 16 is formed on the data scanning line 15 and is etched to form a via-hole above the drain electrode of the TFT. Then a pixel electrode 17 is formed on the protective layer and connected to the drain electrode of the TFT through the via-hole in the protective layer 16.

In order to reduce the number of data drivers as used so as to lower the cost, another structure of duel-gate scanning line is proposed. In such structure of duel-gate scanning line, two gate scanning lines are arranged in parallel on a same layer; although the number of scanning lines is doubled, the total number of data drivers as required is still reduced because the number of data lines is halved.

SUMMARY

Embodiments of the present invention provide an array substrate with excellent display quality.

An aspect of the present invention provides an array substrate, including a substrate; a first gate scanning line formed on the substrate; a first gate insulating layer formed on the first gate scanning line; an active layer formed on the first gate insulating layer; a data scanning line formed on the active layer and perpendicular to the first gate scanning line; a pixel electrode formed in a pixel unit and over the data scanning line, the pixel unit being defined by the first gate scanning line and the data scanning line; and a second gate scanning line formed over or below the first gate scanning line, wherein the second gate scanning line is arranged to be insulated from the first gate scanning line, the active layer, the data scanning line and the pixel electrode, respectively.

In an example, the second gate scanning line is located between the first gate insulating layer and the active layer, and is insulated from the active layer by the second gate insulating layer.

In an example, the second gate scanning line is at least partially overlapped with the first gate scanning line in a stacking direction of the array substrate.

In an example, the first gate scanning line comprises a first conductive strip and a plurality of first projections projecting from a side of the first conductive strip; the first projections being arranged at an equal interval along an extending direction of the first conductive strip on a side of the first conductive strip.

In an example, the second gate scanning line includes a second conductive strip and a plurality of second projections projecting from a side of the second conductive strip; the second conductive strip being overlapped with the first conductive strip in the stacking direction; the second projections being arranged at an equal interval along an extending direction of the second conductive strip on a side of the second conductive strip that is opposite to the first projections, and being arranged alternately with the first projections.

In an example, the second gate scanning line includes a second conductive strip and a plurality of second projections projecting from a side of the second conductive strip; the second conductive strip being overlapped with the first conductive strip in the stacking direction; the second projections being arranged at an equal interval along an extending direction of the second conductive strip on a side of the second conductive strip that is opposite to the first projections, and being arranged to be flushed with the first projections.

In an example, the data scanning line includes a third conductive strip and a plurality of third projections projecting from the third conductive strip; the third conductive strip being perpendicular to the first conductive strip and the second conductive strip, and being located between the first projection and the second projection that is adjacent to each other; the third projections being formed over each of the first projections and the second projections.

In an example, the first insulating layer and/or the second insulating layer is made of a material of organic dielectric film.

In an example, the organic dielectric film includes at least one of polyethylene, polycarbonate, polystyrene, polyimide and acrylate.

In an example, each of the pixel units has two pixel electrodes.

Another aspect of the present invention also provides a method of manufacturing an array substrate, including: fainting a first gate scanning line on a substrate; forming a first gate insulating layer on the first gate scanning line; forming an active layer on the first gate insulating layer; forming a data scanning line on the active layer, the data scanning line is perpendicular to the first gate scanning line; forming a pixel electrode in a pixel unit defined by the first gate scanning line and the data scanning line and over the data scanning line; forming a second gate scanning line over or below the first gate scanning line, wherein the second gate scanning line is arranged to be insulated from the first gate scanning line, the active layer, the data scanning line and the pixel electrode, respectively.

In an example, forming the second gate scanning line between the first insulating layer and the active layer; the second gate scanning line being insulated from the active layer by the second gate insulating layer.

Yet another aspect of the present invention also provides a display device including the array substrate.

BRIEF DESCRIPTION OF THE DRAWINGS

Embodiments of the present invention will be described in more detail below with reference to the accompanying drawings to enable those skilled in the art to understand the present invention more clearly, wherein:

FIGS. 14A and 14B are schematic diagrams illustrating a status of pixel driving in an array substrate when gate scanning the nth row and the n+1th row under a progressive driving mode, respectively;

FIGS. 15A and 15B are schematic diagrams illustrating a status of pixel driving in an array substrate when gate scanning the first gate scanning line and the second gate scanning line in the nth row under a progressive driving mode, respectively;

FIGS. 16A and 16B are schematic diagrams illustrating a status of pixel driving in an array substrate when gate driving the first gate scanning line and the second gate scanning line in the Mth frame under an interlacing driving mode, respectively.

DETAILED DESCRIPTION

In order to make objects, technical details and advantages of the embodiments of the invention apparent, technical solutions according to the embodiments of the present invention will be described clearly and completely as below in conjunction with the accompanying drawings of embodiments of the present invention. It is apparent that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Figure 1:
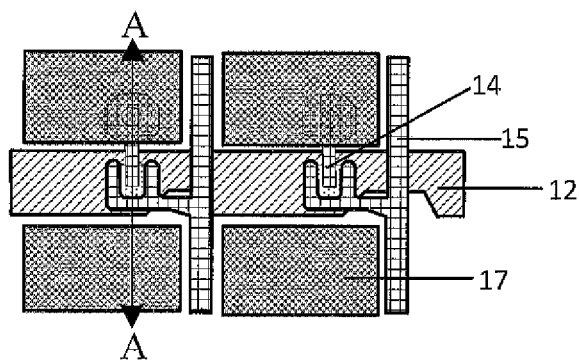
FIG. 1 is a top view illustrating a structure of an array substrate.
Figure 2:
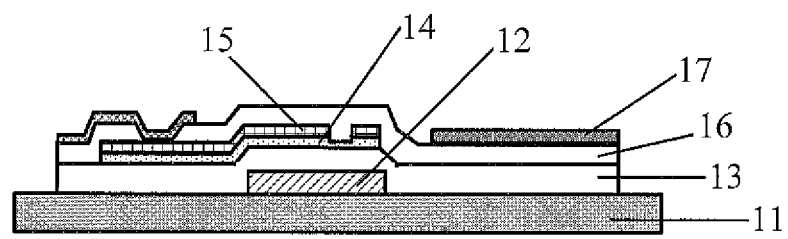
FIG. 2 is a sectional view taken along line A-A of FIG. 1.

The inventors notice that the array substrate as shown in FIG. 1 and FIG. 2 involves defects that a black matrix corresponding to a mesh grid consisted of the data scanning line and the gate scanning line includes relatively more light blocking areas which results in relatively lower aperture ratio and transmittance; a relatively lower resolution of the display panel due to be restricted by the data scanning line and the gate scanning line is disadvantageous for design and manufacture of products with high PPI (Pixels per inch); the display quality is not satisfied by users due to a driving mode of line inversion. Embodiments of the present invention provide an array substrate with excellent display quality.

Figure 3:
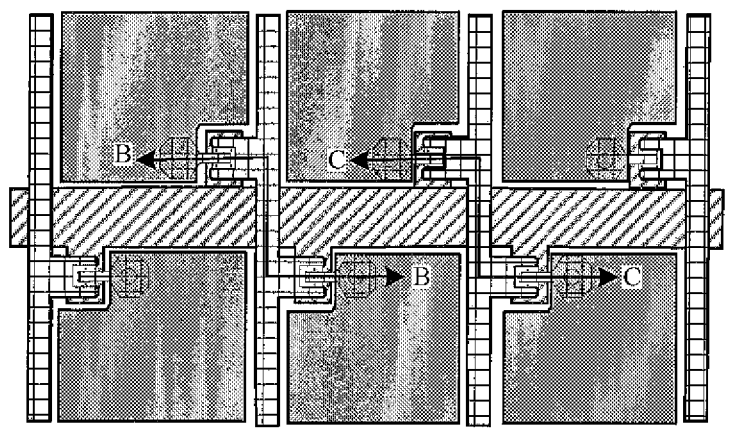
FIG. 3 is a top view illustrating a structure of an array substrate according to an embodiment of the present invention.
Figure 4:
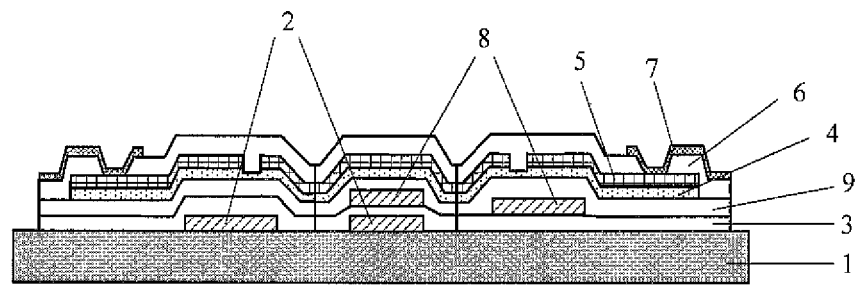
FIG. 4 is a sectional view taken along line B-B of FIG. 3.
Figure 5:
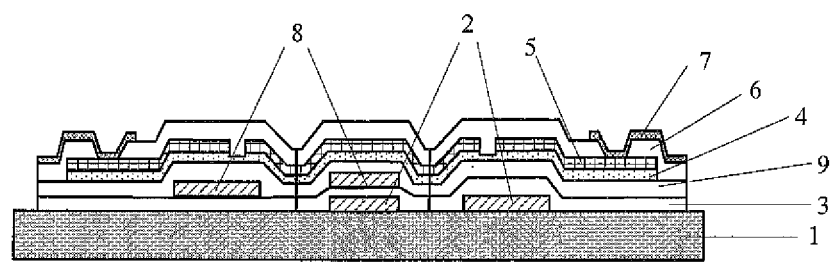
FIG. 5 is a sectional view taken along line C-C of FIG. 3.

FIG. 3 to FIG. 5 are schematic diagrams illustrating a structure of an array substrate according to an embodiment of the present invention, wherein FIG. 3 is a top view illustrating a structure of array substrate according to an embodiment of the present invention, FIG. 4 is a sectional view taken along line B-B of FIG. 3, and FIG. 5 is a sectional view taken along line C-C of FIG. 3. As it can be seen from FIG. 3 to FIG. 5, the array substrate according to an embodiment of the present invention has a structure in which two layers of gate scanning lines, i.e., a layer of a first gate scanning line 2 and a layer of a second gate scanning line 8, are stacked with each other and spaced by a first gate insulating layer 3; a second gate insulating layer 9 is formed on the second gate scanning line 8; then an active layer 4, a data scanning line 5, a protective layer 6 and a pixel electrode 7 are formed on the second gate insulating layer 9 in sequence.

A manufacture method of array substrate according to the embodiment of the present invention includes steps as below.

Figure 6:
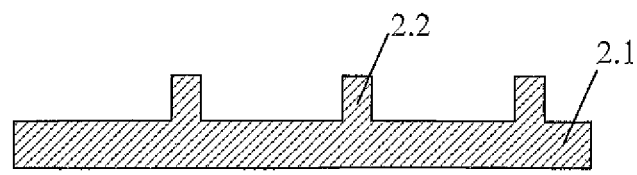
FIGS. 6-10 are top views illustrating structures after performing various steps of a manufacture method of an array substrate according to an embodiment of the present invention, respectively.

Step S1, forming a first gate scanning line 2 on a substrate 1. The substrate is a glass substrate, a plastic substrate or a quartz substrate, for example. FIG. 6 is a top view illustrating a structure as formed after performing a process of the first gate scanning line. As shown in FIG. 6, the first gate scanning line 2 includes a first conductive strip 2.1 and a plurality of first projections 2.2 projecting from a side of the first conductive strip 2.1; the first projections 2.2 are arranged at an equal interval therebetween along an extending direction of the first conductive strip 2.1 on a side of the first conductive 2.1. For example, the first conductive strip 2.1 and the first projections 2.2 are formed integrally.

Step S2, forming a first gate insulating layer 3 on the first gate scanning line 2.

Figure 7:
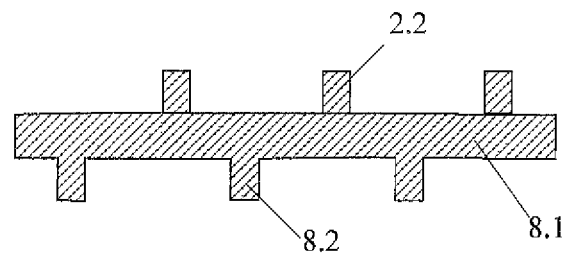

Step S3, forming a second gate scanning line 8 on the first gate insulating layer 3. FIG. 7 is a top view illustrating a structure as formed after performing a process of the second gate scanning line. As shown in FIG. 7, the second gate scanning line 8 includes a second conductive strip 8.1 and a plurality of second projections 8.2 projecting from a side of the second conductive strip 8.1. The second conductive strip 8.1 is overlapped with the first conductive strip 2.1 in a stacking direction. The second projections 8.2 are arranged at an equal space therebetween along an extending direction of the second conductive strip 8.1 on a side of the second conductive strip 8.1 that is opposite to the first projections 2.2, and are arranged alternately with the first projections 2.2. For example, the second conductive strip 8.1 and the second projections 8.2 are formed integrally.

Step S4, forming a second insulating layer 9 on the second gate scanning line 8.

Step S5, forming an active layer 4 on the second insulating layer 9.

Figure 8:
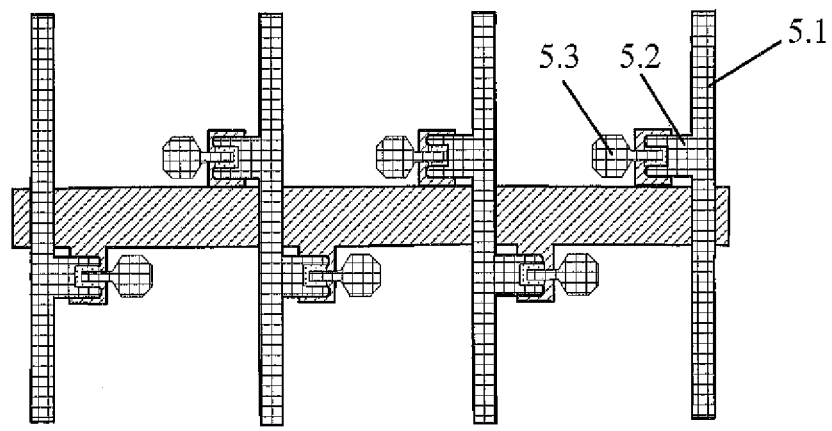

Step S6, forming a data scanning line 5 on the active layer 4. FIG. 8 is a top view illustrating a structure as formed after performing a patterning process of the active layer and the data scanning line. As shown in FIG. 8, the data scanning line 5 includes a third conductive strip 5.1 and a plurality of third projections 5.2 projecting from the third conductive strip 5.1. The third conductive strip 5.1 is perpendicular to the first conductive strip 2.1 and the second conductive strip 8.1, and is located between the first projection 2.2 and the second projection 8.2 that are adjacent to each other. The third projection 5.2 is formed over each of the first projections 2.2 and the second projections 8.2, and serves as a source electrode of a TFT on the array substrate. For example, forming a drain electrode 5.3 of the TFT on the array substrate opposite to the plurality of third projections 5.2.

Figure 9:
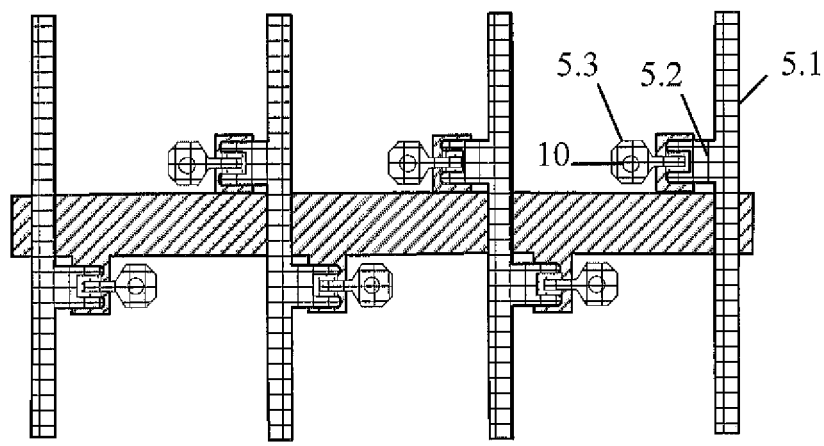

Step S7, forming a protective layer 6 on the data scanning line 5. FIG. 9 is a top view illustrating a structure as formed after performing a process of the protective layer. The protective layer 6 is etched to form a via hole 10 in the protective layer 6 over the drain electrode 5.3.

Figure 10:
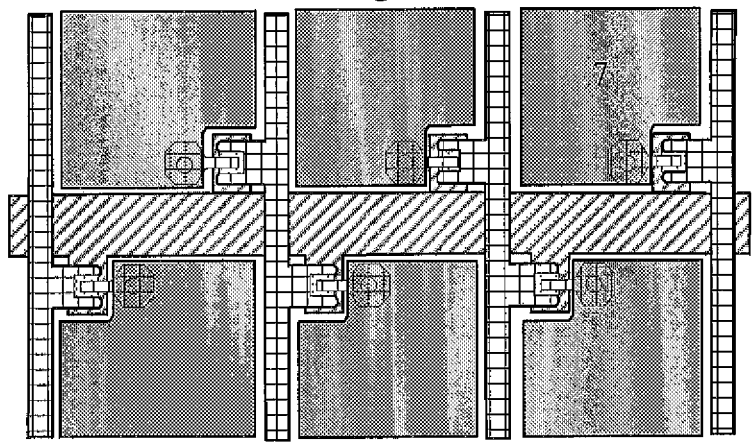

Step S8, forming a pixel electrode 7 on the protective layer 6. FIG. 10 is a top view illustrating a structure as formed after performing a process of the pixel electrode. The pixel electrode 7 is electrically connected to the drain electrode 5.3 through the via hole 10 in the protective layer 6.

Figure 11:
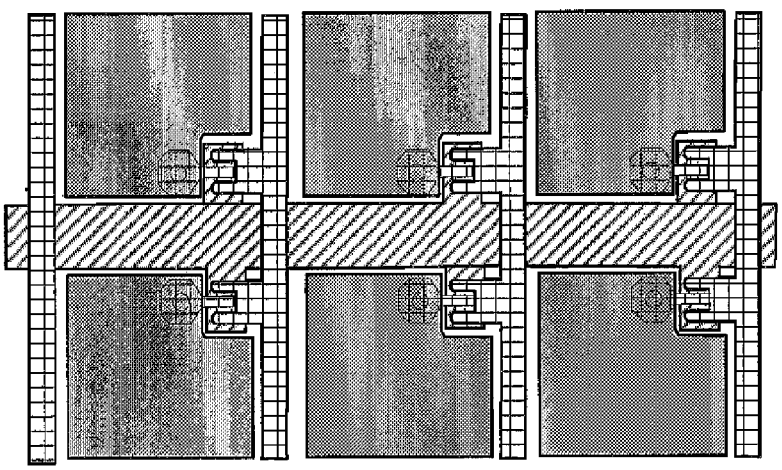
FIG. 11 is a top view illustrating a structure of an array substrate according to another embodiment of the present invention.

FIG. 11 is a top view illustrating a structure of an array substrate according to another embodiment of the present invention. As shown in FIG. 11, the first gate scanning line includes a first conductive strip and a plurality of first projections projecting from a side of the first conductive strip; the first projections are arranged at an equal interval therebetween along an extending direction of the first conductive strip on a side of the first conductive strip. The second gate scanning line includes a second conductive strip and a plurality of second projections projecting from a side of the second conductive strip; the second conductive strip is overlapped with the first conductive strip in a stacking direction; the second projections are arranged at an equal interval therebetween along an extending direction of the second conductive strip on a side of the second conductive strip that is opposite to the first projections, and are arranged to be flushed with the first projections. The data scanning line includes a third conductive strip and a plurality of projections projecting from the third conductive strip; the third conductive strip is perpendicular to the first conductive strip and the second conductive strip, and is arranged at a side of the first projection and second projection which are arranged to be flushed with each other. The Third projection is formed over each of the first projections and the second projections, and serves as a source electrode of a TFT on the array substrate; and a drain electrode of the TFT on the array substrate is formed on the array substrate opposite to the plurality of third projections.

The array substrate and manufacture method of the array substrate provided above are described for purpose of explaining only but not limiting the present invention. It is understood that the second gate scanning line can be located over or below the first gate scanning line instead of being located in a same layer with the first gate scanning line. The second gate scanning line can be located between the first gate insulating layer and the active layer as described in the embodiments above, and can also be located between the active layer and the data scanning line layer, or located between the data scanning line layer and the pixel electrode layer, or located over the pixel electrode layer, or located between the first gate scanning line layer and the glass substrate; but the second gate scanning line layer and the first gate scanning line layer are arranged at different layers, and the second gate scanning line is insulated from an adjacent conductive component (the conductive component herein includes the first gate scanning line, the active layer, the data scanning line or the pixel electrode layer) to achieve normal function of a TFT.

In order to overcome the problem of excessively higher capacitance during a manufacture, the respective scanning lines are made of materials with low resistance, such as copper, to obtain thin lines. Alternatively, a method of increasing the thick of the insulating layer material can be utilized. The insulating layer can also be formed by using materials with relatively larger dielectric constant, such as silicon nitride, zinc oxide, hafnium oxide, zirconium oxide, lead zirconate titanate (PZT), and strontium barium titanate (BST). Other organic dielectric materials with excellent flexibility, light, effective cost and good manufacturability, such as polyethylene, polycarbonate, polystyrene, polyimide and acrylate, can also be used to faint the insulating layer.

Hereafter the advantages of the array substrate as provided by embodiments of the present invention over the normal array substrate will be described in details with reference to corresponding drawings.

Figure 12A:
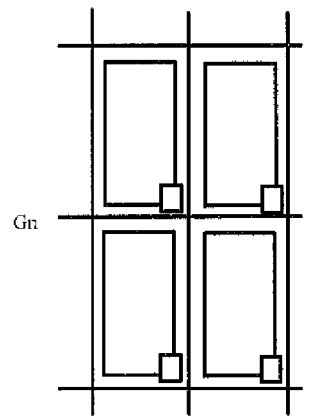
FIG. 12A-12B are schematic diagrams illustrating a resolution of an array substrate.
Figure 12B:
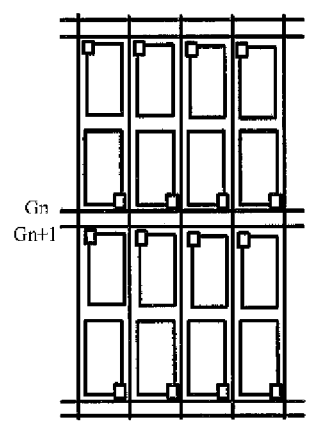
Figure 12C:
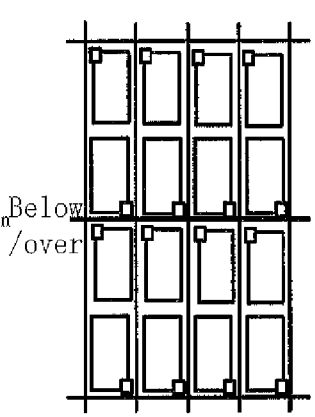
FIG. 12C is a schematic diagram illustrating a resolution of an array substrate according to an embodiment of the present invention.

FIG. 12A is a schematic diagram illustrating a resolution of an array substrate with a single-gate-scanning-line structure, FIG. 12B is a schematic diagram illustrating a resolution of array substrate with a dual-gate-scanning-line structure located in a same layer; as a contrast, FIG. 12C is a schematic diagram illustrating a resolution of the array substrate according to embodiments of the present invention. The array substrate according to embodiments of the present invention is formed with a structure of upper and lower layer of gate scanning line, thus the pixel unit defined by the gate scanning line in lateral direction and the data line in longitudinal direction can be formed with two pixel electrodes therein; that is, two pixel regions. The two pixel regions are driven by the upper and lower layer of gate scanning line, respectively. Given the same area per unit, the pixel region on the array substrate according to embodiments of the present invention can be four times of that on the array substrate with a single-gate scanning line structure, thereby effectively improving the resolution of the display panel; further, as compared with the array substrate with a dual-gate scanning line structure located in a same layer, the area of the pixel region is also increased due to the decreased area occupied by the overlapped gate scanning lines according to embodiments of the present invention.

Figure 13A:
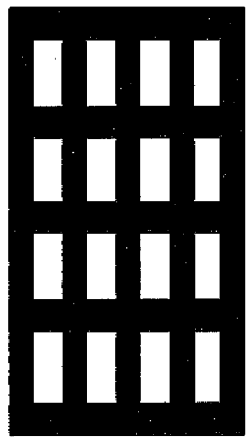
FIGS. 13A and 13B are schematic diagrams illustrating a black matrix of a color filter corresponding to an array substrate.
Figure 13B:
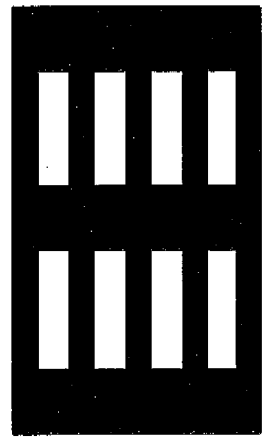
Figure 13C:
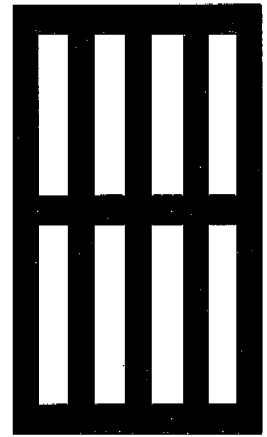
FIG. 13C is a schematic diagram illustrating a black matrix of a color filter corresponding to an array substrate according to an embodiment of the present invention.

FIG. 13A is a schematic diagram illustrating a black matrix of a color filter corresponding to an array substrate with a single-gate scanning line structure, FIG. 13B is a schematic diagram illustrating a black matrix of a color filter corresponding to an array substrate with a dual-gate scanning line structure; as a contrast, FIG. 13C is a schematic diagram illustrating a black matrix of a color filter corresponding to an array substrate according to embodiments of the present invention. The array substrate according to embodiments of the present invention is formed with a structure of upper and lower layers of gate scanning line, thus the pixel unit defined by the gate scanning line in lateral direction and the data line in longitudinal direction can be formed with two pixel regions therein, which are driven by the upper and lower layers of gate scanning line, respectively. A light blocking area on the color filter corresponding to the array substrate according to embodiments of the present invention has a shape corresponding to that formed by gate scanning lines in lateral direction and data lines in a longitudinal direction. Given the same resolution, it can be achieved that the light blocking area corresponding to the gate scanning lines is halved with respective to that of array substrate with a single-gate-scanning-line structure and is also significantly less than that of array substrate with a dual-gate-scanning-line structure located in a same layer, thereby improving the aperture ratio and the transmittance of the display panel.

FIG. 14A is a schematic diagram illustrating a status of pixel driving when gate scanning the nth row, under a progressive driving mode, in an array substrate with a single-gate-scanning-line structure; FIG. 14B is a schematic diagram illustrating a status of pixel driving when gate scanning the n+1th row, under a progressive driving mode, in an array substrate with a single-gate-scanning-line structure. As shown in FIGS. 14A-14B, since such type of display device usually utilizes a line inversion mode, the whole row of pixels corresponding to the nth row of gate are driven to be "+" when scanning the nth row of gate, and the whole row of pixels corresponding to the n+1th row of gate are driven to be "−" when scanning the n+1th row of gate. The picture difference with an inversion of the whole row/line is considerably large, which leads to an unsatisfactory viewing experience by human eyes.

FIG. 15A is a schematic diagram illustrating a status of pixel driving when gate scanning a first gate scanning line in the nth row of gate under a progressive driving mode according to an embodiment of the present invention; FIG. 15B is a schematic diagram illustrating a status of pixel driving when gate scanning a second gate scanning line in the nth row of gate under a progressive driving mode according to the embodiment of the present invention. As shown in FIG. 15A-15B, when gate scanning the nth row of gate, the pixels corresponding to the first gate scanning line in the nth row are driven to be "+"; next, the whole row of pixels corresponding to the second gate scanning line in the nth row are driven to be "−". Thus the pixels are driven alternately so as to achieve a dot inversion. In this way, the picture difference displayed is relatively slight, which leads to a better viewing experience by human eyes.

FIG. 16A is a schematic diagram illustrating a status of pixel driving when pixel driving a first gate scanning line in the Mth frame under an interlace driving mode in an array substrate according to an embodiment of the present invention; FIG. 16B is a schematic diagram illustrating a status of pixel driving when pixel driving a second gate scanning line in the Mth frame under an interlace driving mode in an array substrate according to the embodiment of the present invention. As shown in FIGS. 16A-16B, for the Mth frame, firstly, the pixels on the entire array substrate corresponding to the first gate scanning line are driven to be "+"; next, the whole row of pixels corresponding to the second gate scanning line on the entire array substrate are driven to be "−"; so as to achieve a dot inversion and improve the picture quality.

With the array substrate as provided by embodiments of the present invention, the resolution of display panel is improved. Given the same resolution, the light blocking area is narrowed, and the aperture ratio and transmittance of the display panel are improved. It can achieve a dot inversion and significantly improve the picture quality.

It is understood that the described above are just exemplary implementations and embodiments to describe the present invention. An ordinary person in the art can make various variations and modifications to the present invention without departure from the spirit and the scope of the present invention, and such variations and modifications shall fall in the scope of the present invention defined by the appended claims.

The present application claims the priority of Chinese patent application No. 201310516917.2 filed on Oct. 28, 2013, titled "Array Substrate, Manufacture Method thereof and Display Device", which is entirely incorporated herein by reference.

What is claimed is:

1. An array substrate, comprising:
a substrate;
a first gate scanning line formed on the substrate;
a first gate insulating layer formed on the first gate scanning line;
an active layer formed on the first gate insulating layer;
a data scanning line formed on the active layer and perpendicular to the first gate scanning line;
a pixel electrode formed in a pixel unit defined by the first gate scanning line and the data scanning line and over the data scanning line; and Z
a second gate scanning line formed over or below the first gate scanning line, wherein the second gate scanning line is arranged to be insulated from the first gate scanning line, the active layer, the data scanning line, and the pixel electrode, respectively; wherein the first gate scanning line comprises a first conductive strip and a plurality of first projections projecting from a side of the first conductive strip, the first projections being arranged at an equal interval therebetween along an extending direction of the first conductive strip on a side of the conductive strip and the plurality of first projections and the first conductive strip being formed integrally; the second gate scanning line comprises a second conductive strip and a plurality of second projections projecting from a side of the second conductive strip, the plurality of second projections and the second conductive strip being formed integrally to allow the plurality of first projections and the plurality of second projections being located in different levels that are not coplanar, the second projections being arranged at an equal interval therebetween along an extending direction of the second conductive strip on a side of the second conductive strip that is opposite to the first projections, and the second projections being arranged alternately with the first projections; and wherein the second gate scanning line being is at least partially overlapped with the first gate scanning line in a stacking direction of the array substrate.

2. The array substrate according to claim 1, wherein the second gate scanning line is located between the first gate insulating layer and the active layer, and is insulated from the active layer by the second gate insulating layer.

3. The array substrate according to claim 2, wherein the first gate insulating layer and/or the second gate insulating layer are/is made of a material of organic dielectric film.

4. The array substrate according to claim 3, wherein the organic dielectric film comprises at least one of polyethylene, polycarbonate, polystyrene, polyimide and acrylate.

5. The array substrate according to claim 1, wherein the second conductive strip being overlapped with the first conductive strip in the stacking direction; and the second projections are flushed with the first projections.

6. The array substrate according to claim 1, wherein the data scanning line comprises a third conductive strip and a plurality of third projections projecting from a side of the third conductive strip; the third conductive strip being perpendicular to the first conductive strip and to the second conductive strip, and being located between the first projection and the second projection that are adjacent to each other; and the third projections being formed over each of the first projections and the second projections.

7. The array substrate according to claim 1, wherein each of the pixel units comprises two pixel electrodes.

8. A display device, comprising the array substrate of claim 1.

9. A method of manufacturing an array substrate, comprising:
    forming a first gate scanning line on a substrate;
    forming a first gate insulating layer on the first gate scanning line;
    forming an active layer on the first gate insulating layer;
    forming a data scanning line on the active layer, the data scanning line being perpendicular to the first gate scanning line;
    forming a pixel electrode in a pixel unit defined by the first gate scanning line and the data scanning line and over the data scanning line; and
    forming a second gate scanning line over or below the first gate scanning line;
    wherein the second gate scanning line is insulated from the first gate scanning line, the active layer, the data scanning line and the pixel electrode, respectively;
    wherein the first gate scanning line comprises a first conductive strip and a plurality of first projections projecting from a side of the first conductive strip, the first projections being arranged at an equal interval therebetween along an extending direction of the first conductive strip on a side of the conductive strip and the plurality of first projections and the first conductive strip being formed integrally; the second gate scanning line comprises a second conductive strip and a plurality of second projections projecting from a side of the second conductive strip, the plurality of second projections and the second conductive strip being formed integrally to allow the plurality of first projections and the plurality of second projections being located in different levels that are not coplanar, the second projections being arranged at an equal interval therebetween along an extending direction of the second conductive strip on a side of the second conductive strip that is opposite to the first projections, and being arranged alternately with the first projections; and wherein the second gate scanning line is at least partially overlapped with the first gate scanning line in a stacking direction of the array substrate.

10. The method according to claim 9, wherein the second gate scanning line is formed between the first gate insulating layer and the active layer; the second gate scanning line being insulated from the active layer by the second gate insulating layer.

11. The method according to claim 9, wherein the second conductive strip is overlapped with the first conductive strip in the stacking direction; and the second projections are flushed with the first projections.

12. The method according to claim 9, wherein the data scanning line comprises a third conductive strip and a plurality of third projections projecting from a side of the third conductive strip; the third conductive strip being perpendicular to the first conductive strip and to the second conductive strip, and being located between the first projection and the second projection that are adjacent to each other; and the third projections being formed over each of the first projections and the second projections.

\* \* \* \* \*